Feb. 16, 1960 W. L. FIRESTONE 2,925,563

FREQUENCY MODULATION SYSTEM

Original Filed Feb. 3, 1958

INVENTOR.
William L. Firestone
BY Mueller & Aichele
Attys.

United States Patent Office 2,925,563

Patented Feb. 16, 1960

2,925,563

FREQUENCY MODULATION SYSTEM

William L. Firestone, Highland Park, Ill., assignor to Motorola, Inc., Chicago, Ill., a corporation of Illinois Continuation of abandoned application Serial No. 712,928, February 3, 1958. This application January 2, 1959, Serial No. 784,823

7 Claims. (Cl. 332—26)

Figure 1:
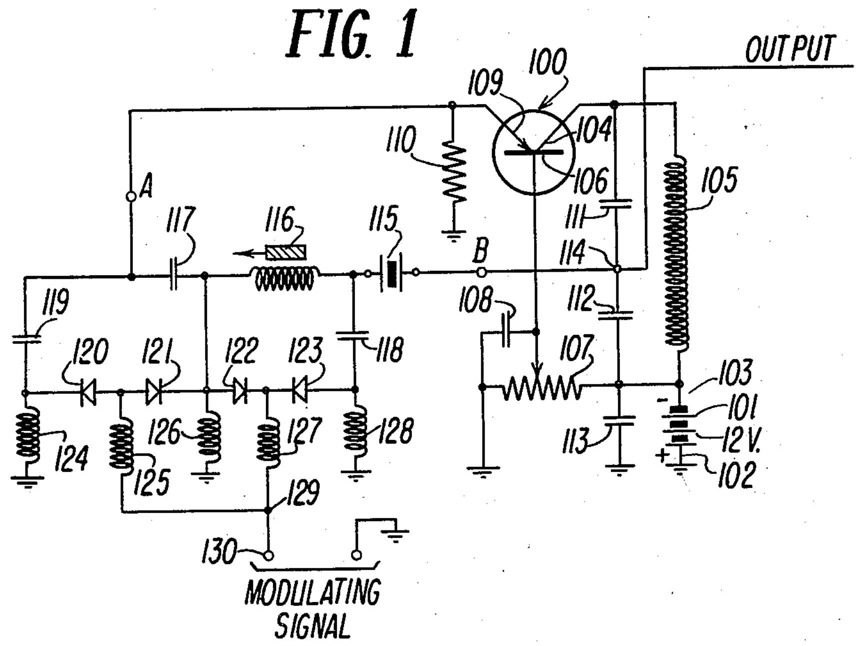

This invention relates to crystal controlled oscillators and more specifically to such an oscillator the frequency of which can be directly varied by control signals to provide frequency modulation signal therefrom. This application is a continuation of application Serial No. 712,928, filed February 3, 1958, now abandoned.

Radio transmitters must have carefully controlled carrier frequencies to maintain signal frequencies within the channels and bands assigned by the Federal Communications Commission. To maintain the required accuracy, it is necessary to include an element such as a piezo-electric crystal oscillating element to provide a sufficiently stable carrier frequency.

In transmitters which vary the frequency of the transmitted carrier in accordance with the modulation signal it has been customary to use one of two basic systems of modulation. The first system uses a small carrier shift in a stable oscillator circuit which may be crystal controlled and have a very low fundamental frequency. A suitable frequency modulated carrier of the correct frequency is obtained by multiplying the carrier frequency which provides a further required increase in frequency deviation at the carrier frequency.

This system is complex requiring many multiplier amplifier stages in the transmitter and a very stable oscillator is required since any frequency drift of the oscillator is also increased by frequency multiplication.

A second system which has been used for generating frequency modulated communication signals requires a fixed oscillator which may be crystal controlled to provide the carrier stability required. A second oscillator which may be frequency modulated directly is used to generate the carrier frequency. An automatic frequency control circuit is used to insure that the average frequency of the frequency modulated oscillator is locked to the stable fixed frequency oscillator. This system is also costly and complex. It would be desirable to have an oscillator with the stable center frequency characteristics of a crystal controlled oscillator, but which can be frequency modulated to a sufficient degree to provide direct frequency modulation.

Accordingly, it is an object of this invention to provide an improved form of frequency modulated oscillator circuit.

It is another object of this invention to provide a frequency modulated oscillator circuit having a crystal controlled center frequency in which sufficient frequency deviation is obtained to eliminate or minimize the need for using frequency multipliers after the frequency modulated oscillator circuit.

It is a further object of this invention to provide a directly modulated oscillator in which the modulator elements provide no frequency shift bias and the center frequency is determined solely by the crystal unit.

A feature of this invention resides in the use of a directly modulated oscillator circuit in which the modulator unit is made up of passive diode circuits requiring power only from the control wave and the oscillator circuit.

Another feature of this invention is the connection of diode circuits in back-to-back configuration in the modulation elements to minimize loading drift in the crystal frequency control circuit.

Yet another feature of this invention is the provision of a frequency modulation circuit using diodes in back-to-back configuration, one of which maintains a high back resistance in the presence of temperature change, the other of which maintains a low capacity across its terminals to minimize temperature effects on the stability of the unmodulated carrier frequency.

Figure 2:
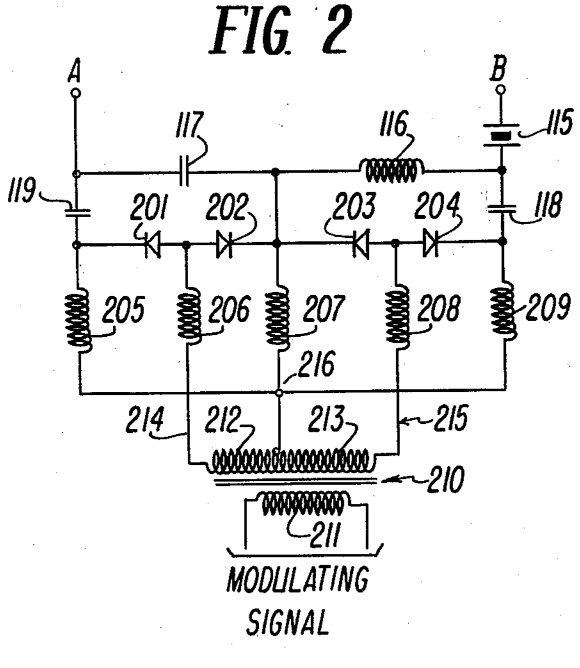

Further objects and features of this invention will be apparent when considering the appended claims and the attached figures, in which:

Fig. 1 illustrates an embodiment of the invention employing a Colpitts type oscillator; and Fig. 2 illustrates a modulator circuit which may be used with a push-pull audio modulation signal.

The circuit of the present invention provides an oscillator circuit with a crystal oscillating element operating to control the oscillator frequency at its series resonant frequency. In an oscillator of this type the frequency of the carrier can be shifted by adding reactance in series with the crystal as explained in the copending application of William Firestone, Serial No. 612,861, filed September 28, 1956. When a resonant circuit is tuned to series resonance at the series resonant frequency of the crystal the oscillator operates at the crystal frequency and has its frequency controlled mainly by the series resonance of the crystal unit. By selectively changing the value of either the capacitive or inductive component of the series resonant circuit the effective resonant frequency of the crystal can be shifted to effect direct frequency modulation which, when the values of L and C are properly chosen to provide sufficient frequency shift of the carrier, can be used as a generator for frequency modulation signals used for voice communication purposes. To effect a controlled change in the effective value of either L or C, the radio frequency current flowing in L or C is bypassed by diode elements shunted across each reactor element and arranged to become conductive in response to audio signals applied thereto.

Referring now to the drawings, Fig. 1 shows a modulated oscillator of the Colpitts type using a transistor amplifier element 100. The necessary operating power is supplied by battery 101 which has its positive terminal 102 grounded. Transistor 100 is of the PNP type and has a negative voltage applied to its collector 104 from the negative battery terminal 103 through conductive inductance element 105. The base 106 is provided with a negative bias by potentiometer 107, which is suitably bypassed for radio frequencies by condenser 108. The emitter 109 is returned to ground through resistor 110. The resistor 110 provides a direct current return path to the most positive point which is the grounded terminal 102 of battery 101 to provide correct bias for the PNP transistor 100. The battery is also bypassed for radio frequencies by a condenser 113. The inductance element 105 is tuned by series capacitors 111 and 112. When a portion of the voltage developed across the parallel resonant combination 105, 111 and 112 in the collector circuit of the transistor 100 is supplied to the emitter 109, oscillations in the parallel resonant circuit may be self-sustaining. The feedback connection to the emitter circuit is made through a series circuit including crystal unit 115, coil 116 and capacitor 117. The coil 116 and capacitor 117 form a series resonant circuit at the series resonant frequency of the crystal unit 115. Since the input impedance is very low oscillations in the transistor circuit can be self-sustaining only at the series resonant point of crystal 115. The result is that the oscillation frequency is accurately controlled by the series resonance of crystal unit 115. Capacitor 119 and series back-to-back diodes 120 and 121 are shunted across capacitor 117.

The diodes 122 and 123 are connected in back-to-back configuration and shunted through blocking condenser 118 across coil 116. Since 122 and 123 are connected back-to-back, voltages appearing across 116 do not produce a current flow through the diodes 122 and 123. The diodes are kept at the R.F. potential of the coil 116 by R.F. chokes 126, 127, and 128.

A similar situation occurs in reference to diodes 120 and 121 wherein voltages appearing across capacitor 117 do not cause conduction in diodes 120 and 121 since they also are connected back-to-back and shunted across 117 through blocking condenser 119. The diodes 120 and 121 are maintained at the R.F. potential af capacitor 117 by R.F. chokes 124, 125, and 126.

When a voltage is applied between the modulating terminal 130 and ground which has a negative polarity, the diodes 122 and 123 become conductive and a current path is established from terminal 130 through R.F. choke 127, diodes 122 and 123, and chokes 126 and 128, to ground. When a conductive path is established by a modulating signal, part of the current which normally flows through coil 116 is bypassed through capacitor 118 and diodes 123 and 122. This changes the effective value of coil 116 and causes a shift in the resonant frequency of coil 116 and capacitor 117, resulting in a frequency shift in the oscillator.

When the modulation voltage is increased, the diodes conduct for a longer portion of the cycle of voltage appearing across coil 116 and the effective value of the coil is further reduced which results in a greater shift in oscillation frequency. When a negative voltage is applied to terminal 130, diodes 120 and 121 do not conduct since this polarity of voltage tends to bias diodes 120 and 121 in a backward direction. When a positive polarity is applied to terminal 130, diodes 120 and 121 become conductive while diodes 122 and 123 are back-biased. When 120 and 121 become conductive and the effective value of capacitor 117 is decreased by bypassing current through 119, 120, and 121 around the capacitor 117 causing the frequency to shift in a direction opposite to that which occurred when diodes 122 and 123 were conductive.

It can be seen that while crystal 115 controls the center frequency, the modulation voltage causes the frequency to shift about this point by an amount proportional to the amplitude in a direction which depends on the polarity. This provides a directly frequency modulated oscillator for use in audio communication transmitters.

When germanium diodes are used, it has been found that some frequency drift occurs due to change in back resistance of germanium diodes with temperature. Silicon diodes which have a higher back resistance may be used. However, the increased capacity of silicon diodes may produce undesirable distortion in the modulated waves. A configuration wherein 120 and 123 are silicon diodes and 121 and 122 are germanium diodes effectively combines the high stable back resistance of silicon diodes with the low series capacity of germanium diodes and provides the advantages of both.

Referring now to Fig. 2, this shows an alternate form of the modulator circuit which can be used directly with push-pull audio signals, or with the aid of unbalance to balance transformer 210 can also be used with single ended audio signals. When the modulator circuit of Fig. 2 is connected to terminals A and B of Fig. 1, in place of the modulating circuit shown thereon, modulation of the oscillator center frequency is accomplished in a manner similar to that described in reference to Fig. 1. It will be noted, however, that diodes 201, 202, 203 and 204 are all conductively responsive to positive voltages at points 214 and 215 derived from secondary winding 212 and 213 of transformer 210. The current path being through chokes 205, 206, 207, 208, and 209, and back to the center tap lead 216 of transformer 210. Frequency modulation is accomplished by applying voltages of opposite or push-pull polarities to leads 214 and 215. The oscillators illustrated have been described in particular as providing a frequency modulated output in presence to the application of control signals thereto, but may also be used to provide slowly varying control of a crystal controlled oscillator. For example, instead of applying modulating signals to the system of Fig. 1, a slowly varying direct current may be applied to provide automatic frequency control of the oscillator frequency. This may be combined with a modulating signal to control the average frequency of the modulated crystal oscillator circuit.

The oscillators of the invention have been found to provide wide deviations of the center frequency of oscillators so that the necessary deviations for signal transmission can be produced either directly or with a minimum of multiplier stages. This greatly simplifies the transmitting equipment in which the oscillator is used.

I claim:

1. A frequency modulated oscillator including in combination, an oscillation control circuit including a crystal unit having a series resonant frequency and a series resonant circuit portion connected in series with said crystal unit, said series resonant circuit portion including reactance means providing resonance in said circuit portion substantially at the series resonant frequency of said crystal unit, said reactance means having a pair of semiconductor diodes connected in series back to back configuration bridged thereacross, a signal input circuit for selectively rendering the series diodes circuit conductive to currents in said reactance means thereby to change the effective value thereof, and means connected to said oscillation control circuit to form a circuit in which oscillations are provided with the frequency of such oscillations varying with the signal applied to said signal input circuit.

2. A frequency modulated oscillator including in combination, an oscillation control circuit including a crystal unit having a series resonant frequency and a series resonant circuit portion connected in series with said crystal unit, said series resonant circuit portion including reactance means providing resonance in said circuit portion substantially at the series resonant frequency of said crystal unit, said series resonant portion comprising a series capacitor unit and a series inductor unit, a first pair of semiconductor diodes connected in series back to back configuration and bridged across said capacitor unit, a second pair of semiconductor diodes connected in series back to back configuration and bridged across said inductor unit, a first circuit for rendering said first pair of semiconductor diodes conductive to current flowing in said capacitor unit and a second circuit for rendering said second pair of semiconductor diodes conductive to current flowing in said inductor unit, means for actuating said first circuit and said second circuits from a single control wave such that said semiconductor diodes of said first pair are rendered conductive by control waves of a predetermined polarity and said semiconductor diodes of said second pair are rendered conductive by opposite polarities of said control waves, and means connected to said oscillation control circuit to form a circuit in which oscillations are produced, with the frequency of such oscillations varying in accordance with said control wave.

3. A frequency modulated oscillator including in combination, an oscillator control circuit including a crystal unit having a series resonant frequency and a series resonant circuit connected in series with said crystal unit, said series resonant circuit being resonant at the series resonant frequency of said crystal unit, a first diode having a silicon semiconductor element and a second diode having a germanium semiconductor element, said first and second diodes being connected in a series back to back configuration and being bridged across a portion of said series resonant circuit, a signal input circuit coupled to said diodes for selectively rendering said diodes conductive to currents flowing in said resonant circuit portion thereby to change the effective reactive value thereof, and means connected to said oscillation control circuit to form a circuit in which oscillations are produced the frequency of which oscillations vary with the signal applied to said signal input circuits.

4. A frequency modulated oscillator including in combination, an oscillation control circuit including a crystal unit having a series resonant frequency and a series resonant circuit portion connected in series with said crystal unit, said series resonant circuit portion including reactance means providing resonance in said circuit portion at substantially the series resonant frequency of said crystal unit, said series resonant portion comprising a series capacitor unit and a series inductor unit, a first pair of semiconductor diodes connected in a series back to back configuration and bridged across said capacitive unit, a second pair of semiconductor diodes connected in series back to back configuration and bridged across said inductor unit, a control circuit for selectively rendering said first and second pairs of semiconductor diodes conductive to current flowing in said reactance means and effective to change the value of said reactance means, said first pair of diodes having a common anode connection and becoming conductively responsive to a signal in said control circuit of positive polarity, said second pair of diodes having a common cathode connection and becoming conductively responsive to a signal of negative polarity in said control circuit, said control circuit rendering said pairs of diodes alternately responsive to control signal waves, and means connected to said oscillation control circuit to form a circuit in which oscillations are produced, with the frequency of such oscillations varying with the signal applied to said control circuit.

5. A frequency modulated oscillator including in combination, an oscillation control circuit including a crystal unit having a series resonant frequency, and a series resonant circuit portion connected in series with said crystal unit, said series circuit portion including a series capacitor unit and a series inductor unit providing resonance in said circuit portion at substantially the series resonant frequency of said crystal unit, a first germanium semiconductor diode and a first silicon semiconductor diode connected in series back to back configuration and bridged across said capacitor unit, a second germanium semiconductor diode and a second silicon diode connected in series back to back configuration and bridged across said inductor unit, a control circuit for selectively rendering said first and second pairs of semiconductor diode circuits conductive to current flowing in said reactance means thereby to change the effective value of said reactance means, said first germanium and said first silicon semiconductor diodes having a common anode connection and becoming conductive in response to a signal in said control circuit of a positive polarity, said second germanium and said second silicon semiconductor diodes having a common cathode connection and becoming conductive in response to a signal of negative polarity in said control circuit, said first and second diodes becoming alternately responsive to alternate wave portions of audio signals, and means connected to said oscillation control circuit to form a circuit in which oscillations are produced, with the frequency of said oscillations varying with the signal applied to said control circuit.

6. A frequency modulated oscillator including in combination, an oscillation control circuit including crystal means and resonant circuit means connected in series with said crystal means, said resonant circuit means being resonant substantially at the series resonant frequency of said crystal means, first and second diode means connected in series back to back configuration across at least a portion of said resonant circuit means, a signal input circuit coupled to said diode means for selectively rendering the same conductive thereby to change the resonant frequency of said resonant circuit means, and means connected to said oscillation control circuit to form a system in which oscillations are provided, with the frequency of such oscillations varying with the signal applied to said signal input circuit.

7. A frequency modulated oscillator including in combination, an oscillator control circuit including crystal means and resonant circuit means connected in series with said crystal means, said resonant circuit means being resonant substantially at the series resonant frequency of said crystal means, a first diode having a silicon semiconductor element and a second diode having a germanium semiconductor element, said first and second diodes being connected in series back to back configuration and being bridged across a portion of said resonant circuit means, a signal input circuit coupled to said diodes for selectively rendering said diodes conductive to currents flowing in said resonant circuit means thereby to change the effective reactive value thereof, and means connected to said oscillation control circuit to form a system in which oscillations are produced, with the frequency of such oscillations varying with the signal applied to said signal input circuit.

No references cited.